United States Patent [19]

Behrens et al.

[11] Patent Number: 4,917,618
[45] Date of Patent: Apr. 17, 1990

[54] MOUNTING SYSTEM FOR PLUG-IN MODULES

[75] Inventors: Ralf Behrens, Nuremberg; Kurt-Michael Schaffer, Eckental; Helmut Schierreich, Veitsbronn, all of Fed. Rep. of Germany

[73] Assignee: Siemens Aktiengesellschaft, Berlin and Munich, Fed. Rep. of Germany

[21] Appl. No.: 302,825

[22] Filed: Jan. 26, 1989

[30] Foreign Application Priority Data

Mar. 2, 1988 [DE] Fed. Rep. of Germany ... 8802800[U]

[51] Int. Cl.$^4$ .............................................. H01R 13/62
[52] U.S. Cl. ..................................... 439/157; 439/328; 439/160
[58] Field of Search ................................. 439/152–160, 439/372, 59, 326–328; 361/399, 412–415

[56] References Cited

U.S. PATENT DOCUMENTS

| | | |
|---|---|---|
| 4,233,646 | 11/1980 | Leung et al. |
| 4,564,250 | 1/1986 | Klein et al. ........................ 361/412 |
| 4,602,835 | 7/1986 | Bauer et al. |
| 4,603,375 | 7/1986 | Miller et al. .......................... 439/59 |
| 4,648,009 | 3/1987 | Beun et al. ......................... 439/160 |
| 4,697,303 | 10/1987 | Matsui et al. ..................... 439/160 |
| 4,699,594 | 10/1987 | Assel et al. ........................ 439/152 |
| 4,783,720 | 11/1988 | Joist et al. ........................ 361/399 |

FOREIGN PATENT DOCUMENTS 0129833 1/1985 European Pat. Off. .
3407877 9/1985 Fed. Rep. of Germany .

Primary Examiner—David Pirolot
Attorney, Agent, or Firm—Kenyon & Kenyon

[57] ABSTRACT

A mounting system for mounting plug-in modules into a module carrier is disclosed. The system comprises a plug-in and pull-out fixture, the fixture having a lever which is connected to the modules by means of an end-piece. The lever is provided with a resilient self-locking detent hook which extends in the lever's locking position behind the corresponding projection of the slot in the end piece, the slot facing downwards towards the transverse bar of the module carrier. This system allows for the insertion & removal of the modules with reduced force compared to the prior art, as well as improved ergonomic handling of the modules.

6 Claims, 3 Drawing Sheets

MOUNTING SYSTEM FOR PLUG-IN MODULES

FIELD OF THE INVENTION

This invention relates to the field of structures assembled by means of plug-in modules. More specifically, it relates to a system for use in inserting and removing mechanical or electrical subassemblies into and from a modular structure.

BACKGROUND OF THE CONVENTION

Mounting systems for plug-in modules are known from U.S. Pat. No. US-PS 4 602 835 where each plug-in module has an upper and lower lever. These levers must be activated simultaneously or nearly so to remove the modules. Additionally, force must be exerted upon both levers when the modules are inserted into the mounting system. Thus, forces from two different directions, albeit along the same axis, must be supplied simultaneously to remove and to insert the modules. Attempting to insert or to remove the modules without proper simultaneous force can result in damage to the modules.

It is an object of this invention to provide a mounting system for plug-in modules, the modules being mounted into module carriers, which system reduces the amount of force required to insert and to remove the plug-in modules and which system improves the ergonomic handling of the modules.

SUMMARY OF THE INVENTION

These objects and others are fulfilled by the present invention wherein each plug-in module is equipped with a plug-in and pull-out fixture, the fixture having a lever which is connected by means of an endpiece to the plug-in module in such a manner that the fulcrum of the lever is supported in the end piece perpendicular to the plane of insertion. The lever is further provided with a slot having an outer and an inner projection which in the lever's locking position extends around a projection corresponding to the slot of a transverse bar of the module carrier. A front plate is connected to the endpiece for positive engagement.

The lever is provided with a self-locking, resilient detent hook which extends, when in the locking position of the lever, behind a corresponding projection in a slot of the end plate which faces the system's transverse bar.

This lever and endpiece of the present invention generate forces during module insertion and removal which are opposite to one another and which extend parallel to the front side of the mounting system. Even under conditions of high mechanical stress, the plug-in module remains reliably connected to the plug-in connector. The system also reduces the forces generated when removing and inserting the plug-in modules and provides more ergonomical handling.

In an advantageous embodiment of the mounting system, the inner projection of the lever slot is provided with a slit in such a manner that the part of the inner projection facing away from the lever slot forms a resilient leg. Using this design, the inner projection of the slot is cocked in the locked position of the lever slot in the slot of the module carrier's transverse bar in such a manner that the locking of the plug-in module is aided. This also increases the reliability of the plug-in connection under vibratory stress.

In another advantageous embodiment of the mounting system, the end piece is provided with a slit extending perpendicular to the plug-in direction. In both walls bordering this slit, a tapped hole is provided which is arranged axially in the plug-in direction. Front plates of a U-section or a flat material of different widths can be used without the need to match the width of the plug-in and pull-out fixture to the width of the front plate Thus, the plug-in and pull-out forces are supplied by the lever at the point where the multi-pin plug-in connectors are arranged at the vertical edge of the plug-in modules circuit board, which eliminates additional lever forces acting on the front plate. The frictional connection of the front plate to the end piece improves the electrical contact of the end piece with the front plate considerably.

In still another advantageous embodiment of the mounting system, if the front plate is wider than the plug-in module, the area not covered by the module's end piece is provided with a cover. The cover is connected to the front plate with a positive form/force engagement connection. This arrangement allows for the use of a front plate wider than the modules while the empty sections of the transverse bar remain covered.

In yet another advantageous embodiment of the mounting system, blind plates consisting of a front plate and two covers are provided for bridging the fronts of parts of the module carrier not occupied by plug-in modules. Thus, any part of the module carrier not occupied by plug-in modules can be bridged cost-effectively with a blind plate, regardless of its width.

These and other objects and advantages of the invention will appear more clearly from the following specification in connection with the accompanying drawings, in which:

DETAILED DESCRIPTION

Figure 1:
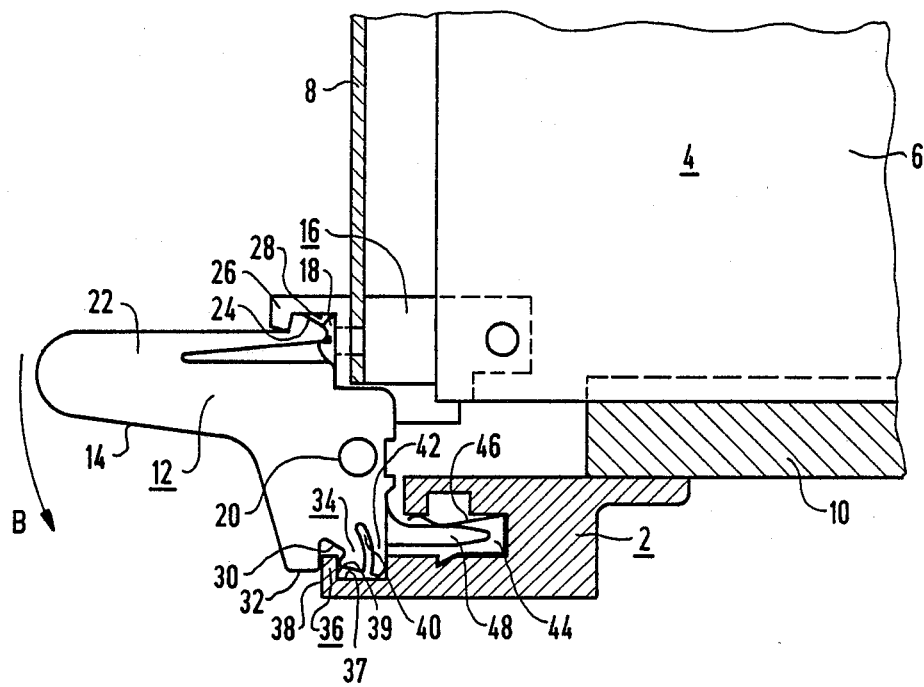
FIG. 1 shows a cross-section of the present invention.

Referring to FIG. 1, a plug-in module carrier is partially depicted, only lower transverse bar 2 being shown for the sake of clarity. The carrier serves to receive plug-in modules 4, each module 4 comprising a circuit board with electronic components and contact elements 6 and a front plate 8, front plate 8 facing the front of the carrier. Each module 4 is guided into its location in the module carrier by guide rails 10. In a plug-in module 4 of two-times Europe format, plug-in and pull-out fixtures 12 are arranged at the upper and lower end of each front plate 8. A module 4 with Europe format contains only one plug-in and pull-out fixture 12. The plug-in and pull-out fixture 12 located at the upper end of module 4 is not shown for the sake of clarity. It is identical with shown fixture 12 and arranged with mirror symmetry.

Plug-in and pull-out fixture 12 comprises a lever 14 and an end piece 16, end piece 16 being mounted on circuit board 6 via screw 17. Additionally, end piece 16 is connected to front plate 8 in a form - and force-fitting manner by means of screw 18. Lever 14 is supported with its axis of rotation 20 perpendicular to the plug-in direction. At the point where lever 14 locks into end piece 16, the lever 14 has been shaped as a handle 22 with a self-locking resilient detent hook 24. Detent hook 24 extends in the locking position of fixture 12 behind a corresponding projection 26 of slot 28 in end piece 16, the slot opening downwards towards transverse bar 2. The inside surface of projection 26 is provided with a predetermined pitch directed toward the bottom of slot 28. The corresponding contact surface of detent hook 24 is shaped in a similar fashion. The spring constant is determined by the length of detent hook 24 in conjunction with the material of lever 14. This corresponding shape and design of detent hook 24 and projection 26 of slot 28 results in reliable electrical and mechanical coupling of module 4 to the carrier, even in a highly stressed environment. However, this self-locking latch can be unlocked by a motion of the lever 14 in the direction of arrow B without placing excess additional force on detent hook 24.

Lever 14 of fixture 12 is also provided with slot 30, the edges of which are designated 32 and 34. In the locked position, slot 30 of lever 14 engages with projection 36 of slot 37 in transverse bar 2 of the module carrier. In case of a tilting motion of lever 14 in the direction toward transverse bar 2 according to arrow B, edge 32 of slot 30 is braced against the outer surface 38 of projection 36. Tilting motion of lever 14 in the opposite direction braces inner projection 34 of slot 30 against inside surface 39 of projection 36. Inner projection 34 has a slit 40 formed so that the part of inner projection 34 facing away from projection 36 forms resilient leg 42. Due to the elasticity of the material of lever 14 and the shape of slit 40, the entire slot width of slot 37 is filled, whereby lever 14 is cocked in the locking position shown.

Transverse bar 2 is provided with cavity 44 having a horizontal U-shaped profile, opening towards the front of the module carrier. Contact means 46 are arranged over the entire length of cavity 44. Contact means 46 takes the form of a leaf spring with comb-like spring tines In the locking position of fixture 12 shown, end piece 16 comes into large-area and, accordingly, low-resistance contact with contact means 46 by means of a tongue-shaped contact area 48 extending parallel to the plug-in direction.

Figure 2:
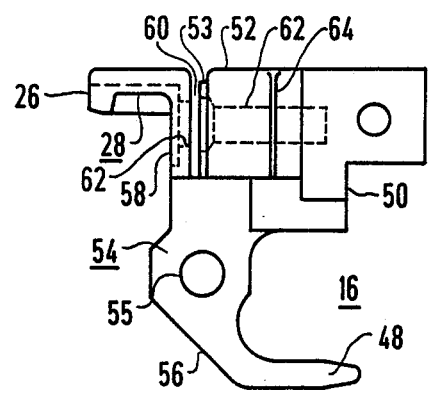
FIG. 2 shows an embodiment of the end piece of the present invention.

FIG. 2 shows an advantageous embodiment of end piece 16. End piece 16 comprises a tongue-shaped contact area 48, a stop and fastening part 50 for coupling end piece 16 to circuit board 6, slot 28 and fastening device 52 for coupling end piece 16 to front plate 8. Contact area 48 is connected to fastening device 62 by means of a connecting piece 54. Connecting piece 54 contains a post extending beyond both sides of piece 54, which post serves as the fulcrum of lever 14. Additionally, connecting piece 54 is tapered toward tongue-like contact area 48, surface 56 extending away from contact area 48 at an angle. Surface 56 serves as a support area for lever 14 in its unlocked position. Lever 14 is forcibly held in this unlocking position by means of a spring which is attached to end piece 16. The inclination of surface 56 is so arranged that, upon inserting module 4 into the module carrier, outer projection 32 of slot 30 comes to lie against outer surface 38 of projection 36, so that lever 14 needs only to be moved in direction of front plate 8 in order to plug-in and lock module 4 in the end position.

Wall 58, which is opposite to projection 26 of slot 28, and fastening device 52 are arranged parallel to each other at a predetermined spacing so slit 60 is formed. Fastening device 52 has shoulder 53 which protrudes into slit 60 and is opposite to wall 58. The width of shoulder 53 is smaller than the width of slit 60. Thus the depth of slit 60 decreases in a step-like fashion, which in turn permits the use of U-shaped front plates 8 or front plates 8 of flat materials of different thickness. Wall 58 and fastening device 52 are each provided with tapped holes 62 which are axially aligned. Fastening device 52 also has a laterally attached detent hook 64. U-shaped front plates 8 whose width is equal to the width of end piece 16 can be connected to this end piece 16 with a positive fit. U-shaped front plates whose width is larger that the width of end piece 16 are bolted additionally to end piece 16, connecting front plates 8 to end piece 16 in a form and force-locking manner. Front plates 8 of flat material can also be used if they are bolted to end piece 16. By use of force-locking fitter connections, the electrical contacts of front plate 8 and end piece 16 are improved substantially.

Figure 3:
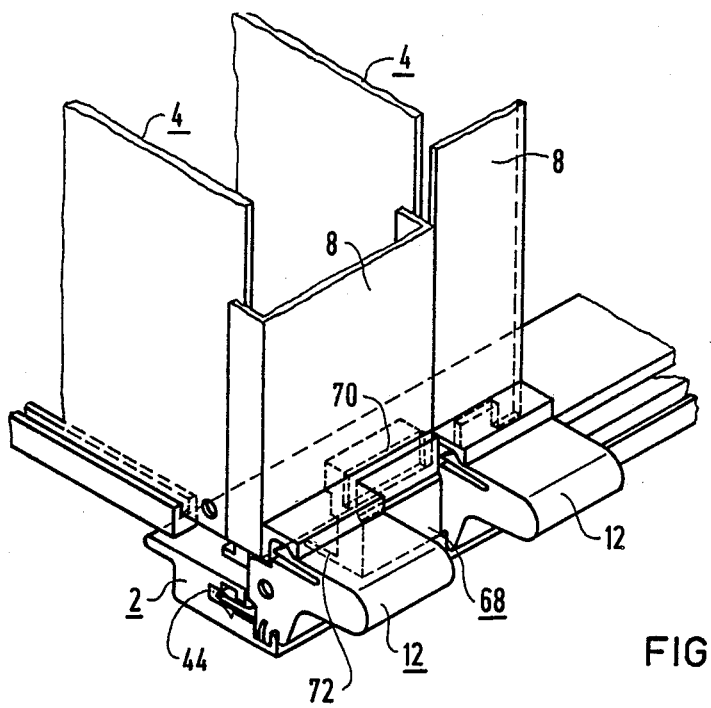
FIG. 3 shows two embodiments of the front plates of present invention.

FIG. 3 shows two different embodiments of the mounting system. Plug-in module 41 is provided with a front plate 81 of flat material, the width of which is equal to that of fixture 121. Plug-in module 42 is provided with a U-shaped front plate 82, the width of which is twice that of fixture 122. The remaining residual width of U-shaped front plate 82 is provided with a cover 68 which can be connected to front plate 82 in a form- and/or force-locking manner. Cover 68 is provided with slit 70 which extends perpendicular to the insertion direction. Cover 68 is also provided with tongue-shaped area 72 which extends in the insertion direction of plug-in module 42. In this figure, tongue-shaped area 72 extends, when module 42 is plugged in, into cavity 44 of transverse bar 2. The height of cover 68 is equal to the spacing of cavity 44 from the lower or upper edge, respectively, of front plate 8 plus the depth of slit 70. Cover 68 can be injection molded or extended by the yard, to be cut by the user of the module to the length desired.

Figure 4:
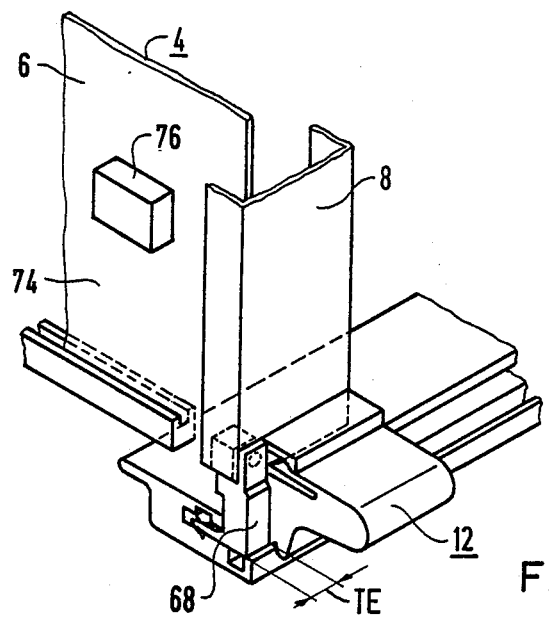
FIG. 4 shows an additional embodiment of the front plate of the present invention.

A further embodiment of the mounting system is shown in FIG. 4. The plug-in module 4 has, in addition to components on the component side of the circuit board 6, components on the reverse side 74 of the circuit board. For clarity, only one surface-mounted device (SMD) 76 is shown. Due to the height of the SMD component, the next detent line is reached in the module carrier whereby the width of front plate 8 is greater by one pitch unit TE than fixture 12. This residual width is provided with cover 68. In this manner front plates 8 of any width can be connected to form a front system with a standard fixture 12, the residual width being provided with corresponding cover 68.

Figure 5:
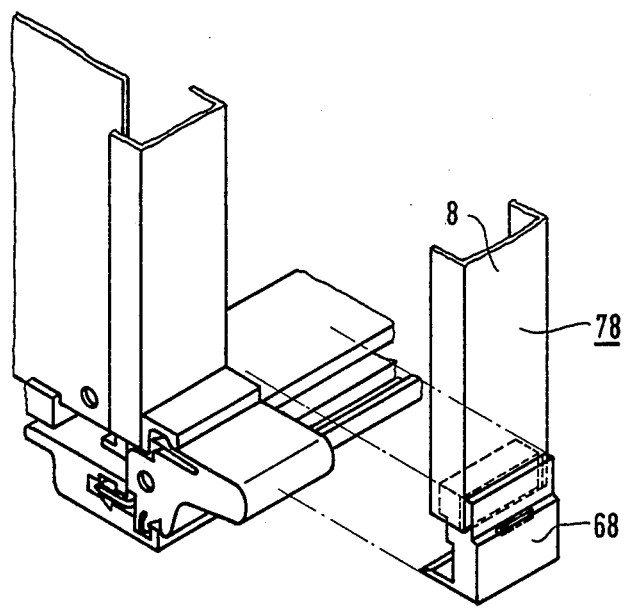
FIG. 5 shows still another embodiment of the present invention using a blind plate.

In FIG. 5 still another embodiment of the mounting system is seen. Here, in addition to plug-in module 4, blind plate 78 is plugged into the module carrier. Blind plate 76 comprises a U-shaped front plate 8 and two covers 68, the upper cover 68 of blind plate 78 not being shown. Cover 68 is connected to front plate 8 in a form - and/or force-fitting manner. The width of front plate 8 can be chosen as desired, preferably as a multiple of the base width, referring to the front dimensions of the module carrier in which it is the be used. Blind plate 78 covers those parts of the module carrier not occupied by plug-in modules 4. Blind plates 78 can also be used to substitute for front plates 8 where the modules 4 have lost their front plates 8.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. A mounting system for a plurality of mounting plug-in modules in a module carrier, the module carrier comprising a metal framework having at least one horizontal transverse bar that defines a transverse bar slot, a projection and a plurality of racks arranged perpendicular to the metal bar for receiving the plug-in modules, the plug-in modules comprising a circuit card that is insertable into the racks of the carrier along an insertion plane, the system comprising:
   a fixture having:
     an end piece coupled to at least one of the plug-in modules, the end piece having an end piece slot with a projection;
     a front plate connected to the end piece in a form-locking manner, forming a front face to the plug-in modules; and
     a lever having a fulcrum, the lever defining a lever slot, inner and outer projections and a resilient detent hook, the lever being coupled to the end piece so that the fulcrum of the lever is supported in the end piece perpendicular to the insertion plane, the inner and outer projections of the lever engaging with the projection of the transverse bar when the lever is in a locking position and the resilient detent hook engaging with the projection of the end piece when the lever is in a locking position, the inner projection of the lever defining a slit formed in such a manner that the inner projection faces away from the lever and forms a resilient leg.

2. The system of claim 1, wherein the end piece has an end piece slit parallel to the transverse bar, the walls of the slit having an aligned axial tapped hole drilled therethrough.

3. The system of claim 1, wherein the transverse bar has a first contact, and the end piece has a tongue-shaped second contact which extends in the direction of insertion of the plug-in modules, the first and second contacts making electrical contact with at least one of the plug-in modules that is inserted into the module carrier.

4. The mounting system of claim 1 further comprising blind plates having a front plate and two covers to cover sections of the module carrier where no plug-in module has been inserted.

5. The system of claim 1, wherein the front plate is wider than the fixture, and further comprising a cover being provided to cover the area below the section of the front plate which extends beyond the fixture.

6. The system of claim 5 wherein the cover defines a cover slit extending perpendicular to the insertion direction and a tongue-shaped area extending from the front side of the cover in the direction of the plug-in module, the tongue-shaped are extending into a portion of the cavity if the transverse bar not occupied by the fixture.

* * * * *